March 12, 1968 E. K. VON FANGE 3,373,371
VHF TUNER NEUTRALIZING CIRCUIT
Filed May 3, 1965

INVENTOR:
EUGENE K. VON FANGE,
BY William S Wolfe
HIS ATTORNEY.

United States Patent Office 3,373,371

Patented Mar. 12, 1968

3,373,371

VHF TUNER NEUTRALIZING CIRCUIT

Eugene K. Von Fange, Syracuse, N.Y., assignor to General Electric Company, a corporation of New York Filed May 3, 1965, Ser. No. 452,808
3 Claims. (Cl. 330—27)

ABSTRACT OF THE DISCLOSURE

In a VHF tuner for a television receiver, a neutralizing circuit for an RF transistor comprising inductive tuning means in series with the collector electrode of the transistor, a source of neutralizing voltage in the form of a capacitor connected to the inductive tuning means, and a series inductor-capacitor arrangement connected between the junction of the inductive tuning means and of the capacitor serving as the source of neutralization voltage and the base of the RF transistor. The capacitor-inductor series arrangement includes an inductor of a value to achieve neutralization at the high channel frequencies while the capacitor is of a value to provide a constant desired output band width for the VHF tuner. The neutralizing circuit also includes a trimmer capacitor connected between the collector electrode of the RF transistor and ground and an RC parallel combination connected between the emitter electrode of the RF transistor and ground.

Figure 1:
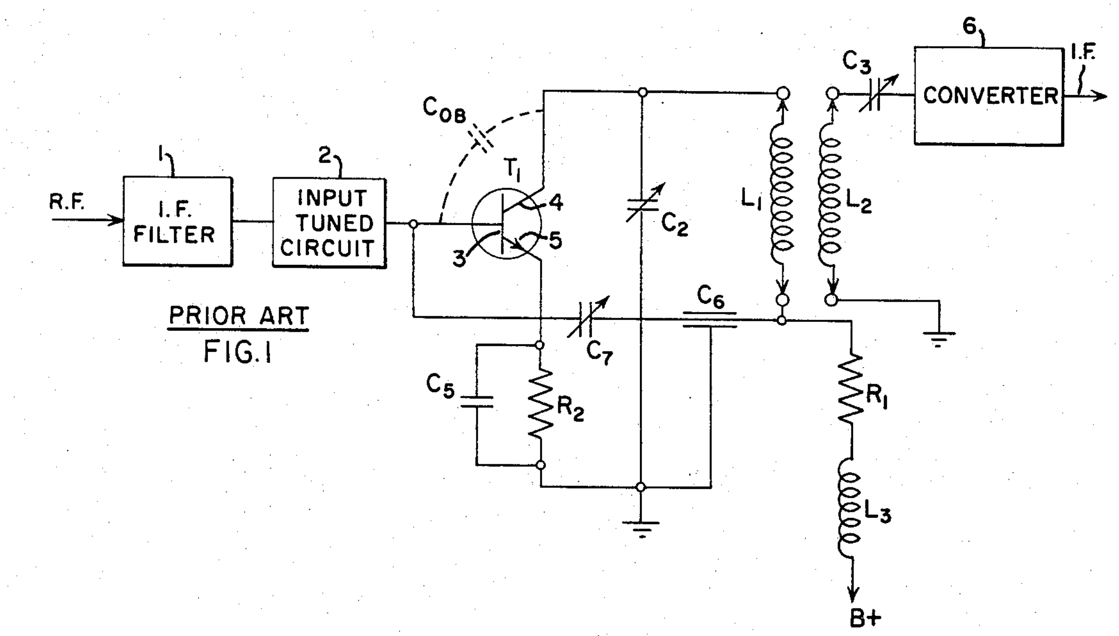
PRIOR ART FIG. 1

The present invention relates to television circuitry and more specifically toward circuitry for neutralizing the RF transistor of a transistorized VHF tuner.

Neutralization of the RF transistor of a VHF tuner is necessary due to the relatively high collector to base capacity of the transistor which, at the relatively high operating frequencies in question, causes internal degenerative feedback between the collector and base and results in spurious operation of the transistor.

In the past various circuits have been utilized to provide the necessary neutralization of the RF transistor. However, none of these circuits has been completely satisfactory.

More specifically, the conventional prior art neutralization circuit which finds wide-spread application in VHF tuners exhibits a number of serious shortcomings. In the conventional circuit the tuned coil of the collector tank circuit of the RF transistor is returned to a capacitor, the capacitor thereby serving as a source of an out-of-phase neutralization voltage. A variable neutralizing capacitor is connected from the neutralization source to the base of the transistor, the variable capacitor being adjusted to apply an out-of-phase signal to the base to thereby compensate for degenerative feedback between the collector and base.

Such an arrangement exhibits several disadvantages. Initially, if a lead-type capacitor is employed as the neutralizing source the neutralizing source is inherently frequency dependent. The frequency dependence results from lead inductance of the capacitor which causes the effective reactance of the capacitor to decrease as frequency increases. Because of this problem it has been necessary in the conventional prior art circuit to employ an expensive feed-through type capacitor as the neutralizing source. However, even when such a capacitor is employed spurious inductances may be present which cause a relatively large reduction in the neutralization voltage available at the channel 13 frequency. Channel 13 is thus almost invariably underneutralized.

Further, any circuit inductance in parallel with the neutralizing source, such as a shunt decoupling choke, tends to increase the impedance of the neutralizing source at the lower frequencies and accordingly to increase the neutralization voltage at the lower channels. Thus, the conventional circuit when adjusted for exact neutralization at channel 2 inherently underneutralizes at channel 13.

Still further, in the conventional prior art circuit the output impedance of the neutralized transistor varies radically from a very high impedance at the lower frequencies to a much lower impedance at the higher frequencies. Thus, since a single tuning capacitor is employed for the entire frequency range, the primary of the interstage coupling circuit exhibits a very narrow band width at low frequencies when adjusted for a normal band width at the higher frequencies. Such variation in band width results in intolerable variations in the tuner bandpass response with frequency.

The present invention provides an improved neutralization circuit for a VHF tuner which completely overcomes the prior art problems.

Accordingly, an object of the invention is to provide an improved neutralizing circuit for use in neutralizing the RF transistor of a VHF tuner.

A further object of the invention is to provide a neutralizing circuit for the RF transistor of a VHF tuner which is less expensive than prior art circuitry.

Still another object is to provide an improved neutralization circuit which provides complete neutralization at the higher frequencies.

Yet, another object is to provide an improved neutralization circuit for a VHF tuner whereby a relatively uniform band width is achieved over the range of frequencies in question.

These and other objects are achieved in one embodiment of the invention through the use of an inductor connected in series with the neutralizing capacitor. By suitable choice of the neutralizing capacitor and the series inductor the apparent neutralizing capacitance necessary for high channel neutralization is achieved. Also, the resultant decrease in apparent neutralizing capacitance as frequency decreases, compensates for lead inductance effects associated with a lead type capacitor. Thus, an inexpensive lead type capacitor can be employed in place of the feed-through type capacitor required by the prior art circuit. Further, the decrease in apparent neutralizing capacitance as frequency decreases, compensates for the effects associated with inductances in parallel with the neutralizing source such as a shunt decoupling choke. Thus, through the use of the series inductor a neutralization voltage is developed which is substantially independent of frequency.

Figure 2:
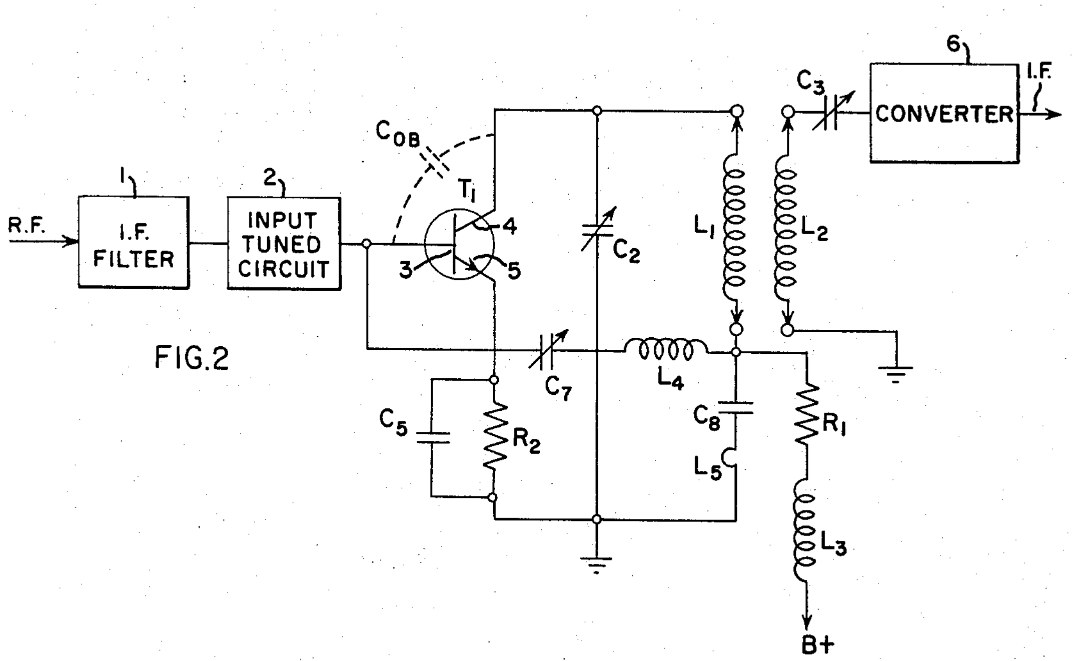

The novel and distinctive features of the invention are set forth in the appended claims. The invention itself together with further objects and advantages thereof, may best be understood by reference to the following description and accompanying drawings in which;

FIGURE 1 is a schematic diagram of the conventional prior art neutralization circuit, and FIGURE 2 is a schematic diagram of an improved neutralization circuit in accordance with the invention.

Referring to FIGURE 1 there is shown the prior art circuit referred to above. The RF signal as derived from a conventional balun is applied to an IF filter generally shown as 1, the output of the IF filter being applied to the input tuned circuit 2 of the RF transistor $T_1$. The transistor $T_1$ serves as an RF amplifier and includes base, collector, and emitter electrodes 3, 4 and 5 respectively.

The output of the input tuned circuit 2 is applied to the base 3 of the transistor $T_1$, an amplified RF signal thus being derived from the collector 4 and developed across an output tuned circuit comprising inductor $L_1$ and capacitor $C_2$. A discrete inductor $L_1$ is provided for each channel to perform the necessary tuning function, the inductor $L_1$ being switched into the circuit in conventional fashion.

The inductor $L_1$ is mutually coupled to an inductance $L_2$ which with capacitor $C_3$ comprises a tuned circuit for application of the amplified RF signal to a converter 6. A discrete inductor $L_2$ is provided for each channel in the same manner as the inductor $L_1$. The inductors $L_1$ and $L_2$ and capacitors $C_2$ and $C_3$ thus comprise a double tuned interstage coupling circuit for application of the RF signal to the converter 6, the output of the converter 6 being the desired IF signal. The B+ voltage is applied to the collector of transistor $T_1$ through inductor $L_1$ and a decoupling circuit comprising resistor $R_1$ and inductor $L_3$. The operating point of the RF transistor $T_1$ is established by a resistor $R_2$ bypassed by a capacitor $C_5$ connected between the emitter 5 of the transistor $T_1$ and ground.

The RF transistor $T_1$ of FIGURE 1 must be neutralized because of the relatively high collector to base capacity of the transistor as indicated in dotted lines in FIGURE 1 and identified as $C_{OB}$, such capacitance causing internal degenerative feedback between the collector and base which results in spurious operation of the transistor.

In the prior art neutralization technique circuit of FIGURE 1 an expensive feed through type capacitor $C_6$ is connected between the inductor $L_1$ and ground. The capacitor $C_6$ serves as a neutralizing source of an out-of-phase neutralization voltage, this voltage being applied to the base 3 of the transistor $T_1$ through a variable neutralizing capacitor $C_7$. In this manner, a voltage is applied to the base 3 which cancels the degenerative feedback caused by $C_{OB}$ and spurious operation is prevented.

However, the prior art circuit of FIGURE 1 exhibits a number of disadvantages. Initially, the use of the expensive feed through type capacitor $C_6$ adds greatly to the cost of the tuner. Further, even when such a feed through capacitor is employed spurious inductances may exist in series with the neutralization source which tends to decrease the impedance of the neutralization source at the higher frequencies thereby resulting in a relatively large reduction of the neutralization voltage available at channel 13 and underneutralization of this channel. On the other hand, the circuit inductances in parallel with the neutralizing source $C_6$ increase the impedance of the neutralizing source at the lower frequencies thereby increasing the neutralization voltage at the lower channels. Because of this basic conflict, the prior art circuit of FIGURE 1 when adjusted for exact neutralization at channel 2 results in inherent underneutralization at channel 13.

Even further, in the prior art circuit of FIGURE 1 the output impedance of the transistor $T_1$ neutralized in this fashion varies radically from a very high impedance at the lower frequencies to a much lower impedance at the higher frequencies. Since a single capacitor $C_2$ is employed in the primary of the interstage coupling circuit for the entire frequency range, the variations in the output impedance of the transistor $T_1$ due to neutralization result in the primary of the interstage coupling circuit exhibiting a band width ranging from a very narrow band at low frequencies to a very wide band at higher frequencies. The band width variations result in intolerable variations in the output response of the tuner.

Referring now to FIGURE 2 there is shown the improved neutralization circuit of the invention, like reference numerals being given to those elements common to FIGURE 1.

In accordance with the invention, an inductor $L_4$ is serially connected with the neutralizing capacitor $C_7$. Through the use of the inductor $L_4$ an inexpensive lead-type capacitor $C_8$ can be employed as a neutralizing source in place of the feed through capacitor $C_6$ of FIGURE 1. The lead inductance of the capacitor $C_8$ is represented by $L_5$ in FIGURE 2.

In accordance with the invention, the inductor $L_4$ is selected to be of such a value that exact neutralization of channel 13 is realized while at the same time maintaining a desirable output bandwidth at channel 2.

It has been noted that low channel gain is only slightly effected by the degree of neutralization, the major effect being the change in the input-output impedance of the RF transistor and thus in output bandwidth. Thus, if $C_7$ is adjusted at channel 2 to the minimum value required to achieve a desirable output bandwidth, series inductance $L_4$ can be added to provided exact neutralization of channel 13. For example, if it were experimentally determined that a neutralizing capacitor $C_7$ having a value of 1 pf. was necessary to secure the desired low-channel bandwidth, and that a neutralizing capacitor having a value of 2.5 pf. was necessary to provide exact neutralization at channel 13, the value of the inductor $L_4$ necessary to convert the 1 pf. capacitor to the value necessary for neutralization at channel 13 could be calculated as follows:

Since a neutralizing capacitor $C_7$ of 1 pf. exhibits an impedance at the channel 13 frequency of 213 mc. of —J746 ohms and the impedance of 2.5 pf. at the channel 13 frequency is —J298 ohms the difference between these two figures or +448 ohms is the amount of impedance that the inductor $L_4$ must add. Thus, an inductor having a value of 334 nhy. must be employed.

In general, the inductor $L_4$ can be employed to adjust for low channel bandwidth and to compensate for the lead inductance $L_5$ of the capacitor $C_8$ and any shunt inductance $L_3$. Such lead and/or shunt inductance normally results in a decrease of the neutralization voltage at the higher frequencies and thus in underneutralization at channel 13. The inductor $L_4$ can be adjusted to compensate for this reduction in neutralization voltage to provide exact neutralization at channel 13.

In a particularly successful embodiment of the invention the following circuit values were employed in conjunction with an SE5003 transistor:

$C_2$----0.5–4.5 pf. trimmer (approximately 3 pf.).
$C_8$----22 pf.
$C_7$----0.5–4 pf. trimmer (approximately 3 pf).
$L_4$----80 nhy.
$R_1$----390Ω.

Although the invention has been described with respect to certain specific embodiments, it will be appreciated that modifications and changes may be made by those skilled in the art without departing from the true spirit and scope of the invention.

What is claimed and desired to be secured by Letters Patent of the United States is:

1. A neutralized television tuner including an RF transistor having collector, base and emitter electrodes and further including:
   (a) an inductive tuning means connected to said collector electrode,
   (b) a first capacitor connected to said inductive tuning means and serving as a source of neutralization voltage, and
   (c) an inductor and a second capacitor serially connected between said first capacitor and the base of said transistor, said second capacitor having a fixed value for a predetermined value of said inductor.

2. A neutralized television tuner including an RF transistor having collector, base and emitter electrodes and further including:
   (a) a variable inductor connected between said collector and a circuit point,
   (b) a first capacitor connected between said circuit point and ground and serving as a source of neutralization voltage, and
   (c) an inductor having a predetermined value and a second capacitor serially connected between said circuit point and said base of said transistor wherein said second capacitor includes a lead inductance associated therewith, the predetermined value of said inductor being greater than the value of said lead inductance.

3. The neutralized television tuner defined in claim 2 wherein said second capacitor has a value which provides a desired output bandwidth at the low channel frequencies and said inductor has a value which increases the effective capacitance between said circuit point and said base to provide exact neutralization at the high channel frequencies.

References Cited

UNITED STATES PATENTS

| | | | |
|---|---|---|---|
| 3,253,229 | 5/1966 | Carlson | 330—27 |
| 2,949,580 | 8/1960 | Eland. | |

ROY LAKE, *Primary Examiner.*

J. B. MULLINS, *Assistant Examiner.*